US007990222B2

(12) United States Patent
Wang

(10) Patent No.: US 7,990,222 B2
(45) Date of Patent: Aug. 2, 2011

(54) CONVERTER WITH PARALLEL COUPLED DIFFERENTIAL INPUT PAIRS

(75) Inventor: Zhenhua Wang, Eindhoven (NL)

(73) Assignee: ST-Ericsson SA, Plan-les-Ouates (CH)

( * ) Notice: Subject to any disclaimer, the term of this patent is extended or adjusted under 35 U.S.C. 154(b) by 22 days.

(21) Appl. No.: 12/298,262

(22) PCT Filed: Mar. 21, 2007

(86) PCT No.: PCT/IB2007/050994
§ 371 (c)(1),
(2), (4) Date: Mar. 5, 2009

(87) PCT Pub. No.: WO2007/107963
PCT Pub. Date: Sep. 27, 2007

(65) Prior Publication Data
US 2010/0019746 A1    Jan. 28, 2010

(30) Foreign Application Priority Data

Mar. 23, 2006 (EP) .................................... 06300280

(51) Int. Cl.
*H03F 3/45* (2006.01)
(52) U.S. Cl. ........................................ 330/301; 323/273
(58) Field of Classification Search .................. 330/301, 330/252–261, 310–311, 295; 323/273; 327/100
See application file for complete search history.

(56) References Cited

U.S. PATENT DOCUMENTS 5,808,513 A * 9/1998 Archer .......................... 330/253
6,111,437 A    8/2000 Patel
7,064,609 B1 * 6/2006 Beck et al. .................... 330/253
7,208,925 B2 * 4/2007 Rose ............................. 323/280
2005/0258901 A1  11/2005 Khorramabadi

FOREIGN PATENT DOCUMENTS

JP         2002-176770 A       6/2002

OTHER PUBLICATIONS

Huang et al., "Novel Fully-Integrated Active Filters Using the CMOS Differential Difference Amplifier," IEEE, pp. 173-176, Aug. 14, 1989.
Säckinger et al., "A Versatile Building Block: The CMOS Differential Difference Amplifier," IEEE Journal of Solid-State Circuits, 22(2):287-294, Apr. 1987.

* cited by examiner

*Primary Examiner* — Hieu P Nguyen
(74) *Attorney, Agent, or Firm* — Robert Iannucci; Seed IP Law Group PLLC

(57) ABSTRACT

A circuit for converting first and second differential input signals into an output signal is provided with a first differential input stage comprising first and second inputs for receiving the first differential input signal and comprising first and second outputs and with a second differential input stage comprising third and fourth inputs for receiving the second differential input signal and comprising third and fourth outputs and with an output stage comprising a first terminal connected to the first output that is further connected to the third output and comprising a second terminal connected to the second output that is further connected to the fourth output and comprising a third terminal for providing the output signal, to avoid complex operational amplifiers. The differential input stages comprise two pairs of transistors and the output stage comprises a current mirror with a third pair of transistors. A regulator comprises the circuit and a modulator stage for in response to the output signal modulating a voltage supply signal.

8 Claims, 3 Drawing Sheets

CONVERTER WITH PARALLEL COUPLED DIFFERENTIAL INPUT PAIRS

FIELD OF THE INVENTION

The invention relates to a circuit for converting first and second differential input signals into an output signal, and also relates to a regulator comprising a circuit, to a device comprising a regulator, and to a method.

Examples of such a regulator are switched mode power supplies and other kinds of power supplies. Examples of such a device are consumer products and non-consumer products.

BACKGROUND OF THE INVENTION

A particular prior art circuit for converting a first differential input signal into an output signal is known from US 2005/0258901.

A general prior art circuit for converting a first differential input signal into an output signal is an operational amplifier. To create a circuit for converting first and second differential input signals into an output signal, three operational amplifiers may be required. A first operational amplifier converts the first differential input signal into a first intermediate signal, and a second operational amplifier converts the second differential input signal into a second intermediate signal, and a third operational amplifier converts the first and second intermediate signals into the output signal. Usually, common mode feedback circuitry coupled to the outputs of the first and second operational amplifiers may further be required for controlling these first and second operational amplifiers.

The prior art circuit for converting first and second differential input signals into an output signal is disadvantageous, inter alia, owing to the fact that it is relatively complex.

SUMMARY OF THE INVENTION

It is an object of the invention, inter alia, to provide a relatively simple circuit for converting first and second differential input signals into an output signal.

Further objects of the invention are, inter alia, to provide a regulator comprising a relatively simple circuit, a device comprising a regulator and a method.

The circuit according to the invention for converting first and second differential input signals into an output signal comprises:
  a first differential input stage comprising first and second inputs for receiving the first differential input signal and comprising first and second outputs,
  a second differential input stage comprising third and fourth inputs for receiving the second differential input signal and comprising third and fourth outputs, and
  an output stage comprising a first terminal connected to the first output and comprising a second terminal connected to the second output and comprising a third terminal for providing the output signal, the first output further being connected to the third output and the second output further being connected to the fourth output.

By providing the circuit with two differential input stages that are connected in parallel to each other owing to the fact that the first output is connected to the third output and that the second output is connected to the fourth output, the two differential input stages together produce a resulting intermediate signal. By further providing the circuit with the output stage that converts the resulting intermediate signal into the output signal, a simple circuit has been created, owing to the fact that each stage can for example be realized with only a few transistors.

The circuit according to the invention is further advantageous, inter alia, in that it does not require three complex operational amplifiers and complex common mode feedback circuitry.

An embodiment of the circuit according to the invention is defined by the first differential input stage comprising a first pair of transistors comprising first main electrodes connected to each other and comprising control electrodes constituting the first and second inputs and comprising second main electrodes constituting the first and second outputs, and the second differential input stage comprising a second pair of transistors comprising first main electrodes connected to each other and comprising control electrodes constituting the third and fourth inputs and comprising second main electrodes constituting the third and fourth outputs. This embodiment is extremely simple.

An embodiment of the circuit according to the invention is defined by the output stage comprising a current mirror stage that comprises a fifth input constituting the first terminal and comprises a fifth output constituting the second terminal, the current mirror stage comprising a third pair of transistors comprising control electrodes connected to each other and comprising first main electrodes connected to each other and comprising second main electrodes constituting the fifth input and the fifth output, the fifth input being connected to the control electrodes of the third pair of transistors, and the output stage further comprising a transistor comprising a control electrode connected to the fifth output and comprising a main electrode constituting the third terminal. This embodiment is extremely simple.

The regulator according to the invention comprises the circuit according to the invention and further comprises a modulator stage for in response to the output signal modulating a voltage supply signal. Such a modulator stage for example comprises a pulse width modulator stage, in which case the output signal is used to define a pulse width and/or a duty cycle of the pulses produced by the pulse width modulator stage. Other kinds of modulator stages are not to be excluded.

An embodiment of the regulator according to the invention is defined by further comprising a first resistor, one side of the first resistor being connected to the second input and to one side of a second resistor, the other side of the second resistor being connected to the fourth input and to ground, the first input being connected to a reference terminal, the other side of the first resistor being connectable to one side of a load, and the third input being connectable to the other side of the load. This regulator has the ability to stabilize an output voltage across the load.

An embodiment of the regulator according to the invention is defined by further comprising an inductor, one side of the inductor being connected to the modulator stage and the other side of the inductor being connected to one side of a first wire, the other side of the first wire being connectable to the one side of the load, and the ground being connected to one side of a second wire, the other side of the second wire being connectable to the other side of the load. This regulator has the ability to compensate for voltage drops across the wires.

The device according to the invention may comprise the regulator according to the invention and may further comprise a voltage supply for providing the voltage supply signal.

The device according to the invention may comprise the regulator according to the invention and may further comprise the load.

The device according to the invention may comprise the regulator according to the invention and may further comprise the wires.

Embodiments of the method according to the invention correspond with the embodiments of the circuit according to the invention and/or of the device according to the invention.

The invention is based upon an insight, inter alia, that prior art circuits for converting first and second differential input signals into an output signal are complex, and is based upon a basic idea, inter alia, that two simple differential input stages connected in parallel to each other and connected to a simple output stage will do.

The invention solves the problem, inter alia, to provide a relatively simple circuit for converting first and second differential input signals into an output signal, and is further advantageous, inter alia, in that it does not require three complex operational amplifiers and complex common mode feedback circuitry.

These and other aspects of the invention will be apparent from and elucidated with reference to the embodiments(s) described hereinafter.

DESCRIPTION OF EMBODIMENTS

Figure 1:
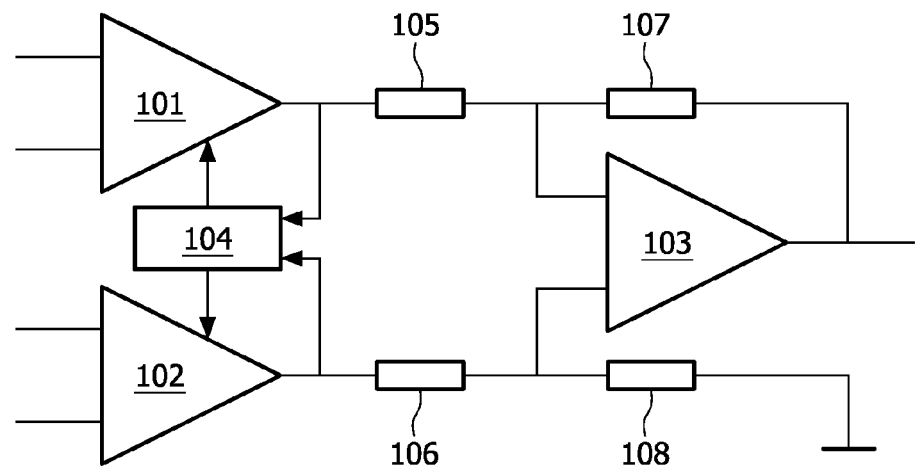
FIG. 1 shows diagrammatically a prior art circuit.

The prior art circuit shown in the FIG. 1 comprises three operational amplifiers 101-103. A first operational amplifier 101 comprises two inputs and an output connected to one side of a resistor 105 and to a first input of a common mode feedback unit 104. A second operational amplifier 102 comprises two inputs and an output connected to one side of a resistor 106 and to a second input of the common mode feedback unit 104. First and second outputs of the common mode feedback unit 104 are connected to control inputs of the operational amplifiers 101 and 102. The other side of the resistor 105 is connected to an input of a third operational amplifier 103 and to one side of a resistor 107 and the other side of the resistor 106 is connected to an other input of the third operational amplifier 103 and to one side of a resistor 108. The other side of the resistor 107 is connected to an output of the operational amplifier 103 and the other side of the resistor 108 is connected to ground.

This prior art circuit converts two differential input signals into an output signal via three complex operational amplifiers and a complex common mode feedback unit.

Figure 2:
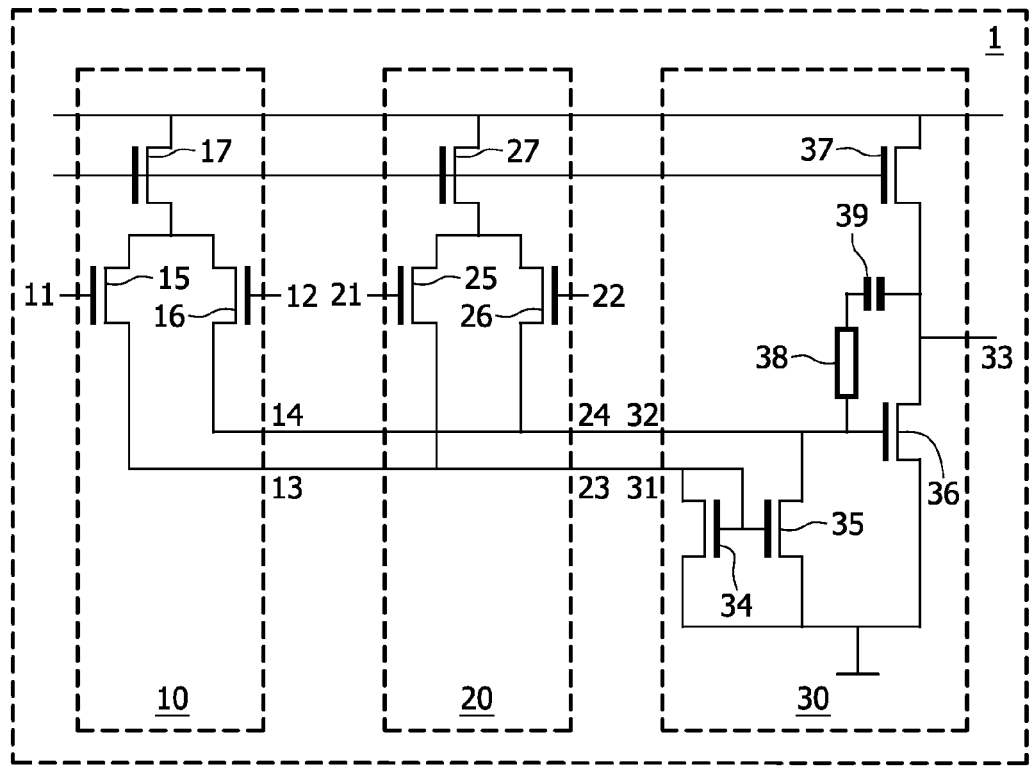
FIG. 2 shows diagrammatically a circuit according to the invention.

The simple circuit 1 according to the invention shown in the FIG. 2 comprises a first differential input stage 10 comprising first and second inputs 11,12 for receiving the first differential input signal and comprising first and second outputs 13,14 and comprises a second differential input stage 20 comprising third and fourth inputs 21,22 for receiving the second differential input signal and comprising third and fourth outputs 23,24 and comprises an output stage 30 comprising a first terminal 31 connected to the first output 13 and comprising a second terminal 32 connected to the second output 14 and comprising a third terminal 33 for providing the output signal. The first and second differential input stages are connected in parallel such that the first output 13 is further connected to the third output 23 and the second output 14 is further connected to the fourth output 24.

The first differential input stage 10 comprises a first pair of transistors 15,16 comprising first main electrodes connected to each other and to a main electrode of a transistor 17 and comprising control electrodes constituting the first and second inputs 11,12 and comprising second main electrodes constituting the first and second outputs 13,14. The second differential input stage 20 comprises a second pair of transistors 25,26 comprising first main electrodes connected to each other and to a main electrode of a transistor 27 and comprising control electrodes constituting the third and fourth inputs 21,22 and comprising second main electrodes constituting the third and fourth outputs 23,24.

The output stage 30 comprises a current mirror stage that comprises a fifth input constituting the first terminal 31 and comprises a fifth output constituting the second terminal 32. The current mirror stage comprises a third pair of transistors 34,35 comprising control electrodes connected to each other and comprising first main electrodes connected to each other and to ground and comprising second main electrodes constituting the fifth input and the fifth output. The fifth input is connected to the control electrodes of the third pair of transistors 34,35, and the output stage 30 further comprises a transistor 36 comprising a control electrode connected to the fifth output and comprising a main electrode constituting the third terminal 33 and comprising a further main electrode connected to ground. The third terminal 33 is further connected to a main electrode of a transistor 37 and is further connected via a serial construction of a capacitor 39 and a resistor 38 to the control electrode of the transistor 36. Further main electrodes of the transistors 17, 27, 37 are connected to each other and to a supplying terminal, and control electrodes of the transistors 17, 27, 37 are connected to each other and to a further supplying terminal. These transistors 17, 27, 37 have a biasing function.

The device 5 according to the invention comprises a regulator 4 according to the invention. This regulator 4 comprises the circuit 1 and further comprises a modulator stage 40 for in response to the output signal modulating a voltage supply signal originating from a voltage supply 54. Thereto, the modulator stage 40 comprises a modulator 41 comprising an input connected to the third terminal 33 and comprising a first output connected to a control electrode of a transistor 42 and comprising a second output connected to a control electrode of a transistor 43. A main electrode of the transistor 42 is connected to the voltage supply 54 and a further main electrode is connected to one side of an inductor 44. A main electrode of the transistor 43 is connected to the one side of the inductor 44 and a further main electrode of the transistor 43 is connected to ground.

The modulator 41 for example comprises a pulse width modulator, in which case the output signal from the circuit 1 is used to define a pulse width and/or a duty cycle of the pulses produced by the pulse width modulator.

The regulator 4 comprises a first resistor 45. One side of the first resistor 45 is connected to the second input 12 and to one side of a second resistor 46. The other side of the second resistor 46 is connected to the fourth input 22 and to ground. The first input 11 is connected to a reference terminal 48. The other side of the first resistor 45 is connected to one side of a load 51. The third input 21 is connected to the other side of the load 51.

The other side of the inductor 44 is connected to one side of a first wire 52 and via a capacitor 47 to ground. The other side of the first wire 52 is connected to the one side of the load 51. The ground is connected to one side of a second wire 53. The other side of the second wire 53 is connected to the other side of the load 51.

Each transistor can be a N-FET or a P-FET or a N-MOS or a P-MOS etc. without excluding other kinds of transistors. Further elements may be introduced for example for biasing purposes without departing from the scope of this invention.

High performance systems demand high performance power supplies. For example, in order to guarantee proper operation, the supply voltage of Pentium 4 microprocessors must be strictly limited to 1.25V-1.4V. Designing a power supply outputting a nominal voltage of 1.325V is not difficult, but it is challenging to ensure the above specified range for the microprocessor. As the processor draws a current as high as 78A and represents a load of 17 mΩ only, even a very small parasitic resistance along the power supply lines can produce an unacceptable IR drop (voltage drop). Because parasitic resistances are hard to predict and difficult to control, and because in most applications the supply current is varying, pre-compensation is difficult. The answer to this problem is to add IR drop compensation to switching regulators and linear regulators. The simplest one is partial compensation. It uses an extra connection to sense the voltage at the supply terminal of the processor. In this case only the voltage drop along the supply path is compensated whereas the voltage drop along the return path is left uncompensated, mainly for cost reasons. A full compensation will compensate both voltage drops. A full compensation comes at a high price because it requires many components, for example three operational amplifiers, four resistors, a common mode feedback unit, and one additional sensing lead, etc. as shown in the FIG. 1. Obviously, this price is too high for many commercial products. This kind of realization is indeed complex. Being in the feedback loop, the added difference amplifier and floating voltage add unavoidable complexity and phase delay, thus worsening the stability and loop dynamics. To reduce these effects, the bandwidth of both has to be very wide. Further inconvenient and troublesome is that the programmability of the output voltage is lost for good. As only a fixed voltage is available, the production costs increase, the application flexibility is lost, and application areas are limited.

According to the invention, a breakthrough is reported, which enables a full compensation with negligible overhead/costs. With this invention, it is expected that full and dynamic compensation will soon become an industry standard for commercial regulator products.

The invention preserves the programmability of the output voltage, the implementation is extremely simple, only three transistors have to be added, loop dynamics are preserved, loop stability is preserved, virtually there is no overhead in the silicon area, virtually there is no overhead in power consumption compared to products without an IR drop compensation, high-level integration, all at low costs.

The loop dynamic is a very important aspect in the design of switching regulators. With the proposed full and dynamic compensation based on the circuit 1 as shown in the FIG. 2, the same loop dynamic can be maintained if the four-input error amplifier (the circuit 1) has the same frequency characteristics as that of the original two-input error amplifier. This is readily achievable with the one shown in the FIG. 2.

Figure 3:
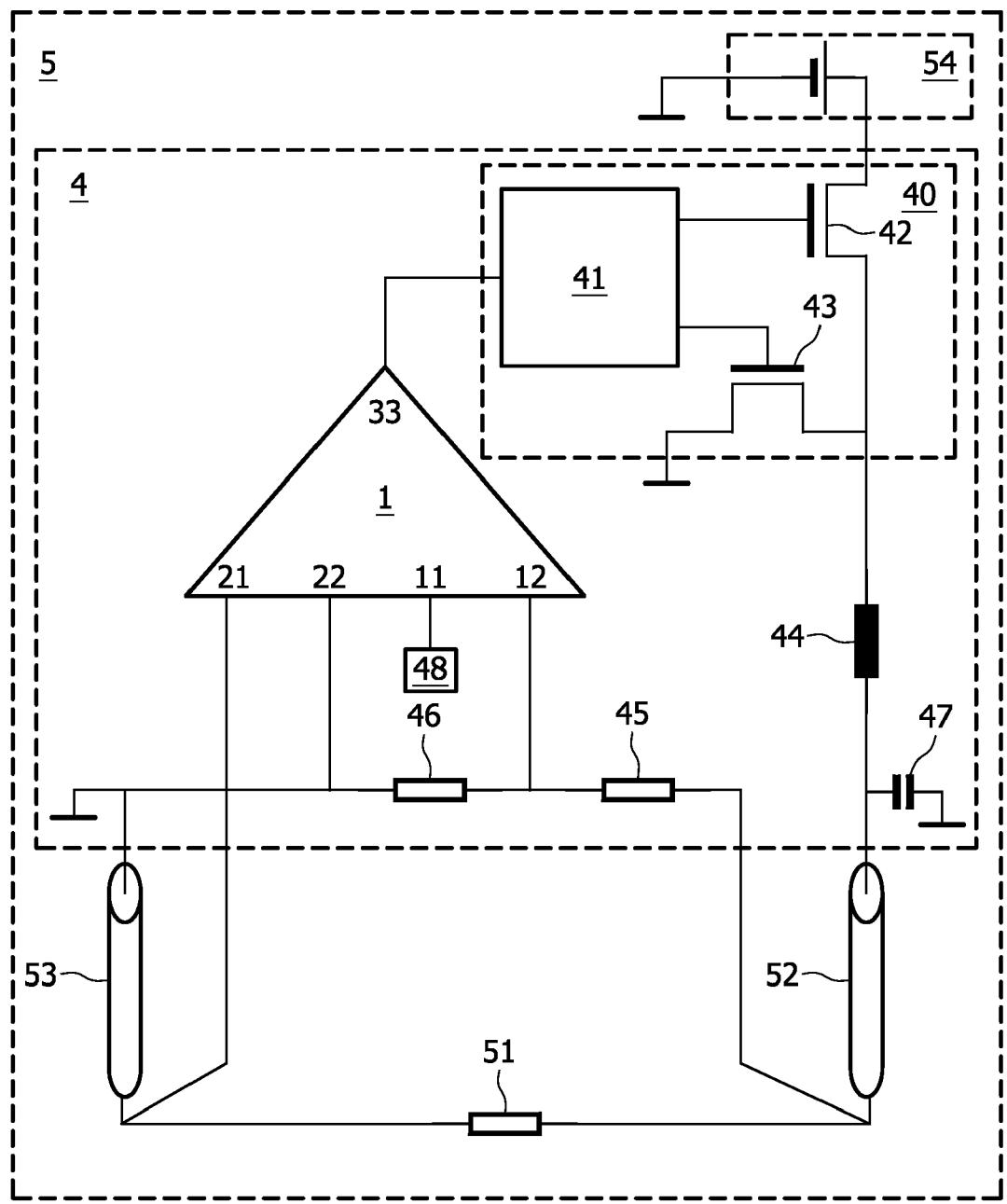
FIG. 3 shows diagrammatically a device according to the invention.

The switching regulator using the proposed full compensation method is shown in the FIG. 3. The two input differential pairs of the error amplifier are connected as shown. The sampled output voltage and the reference voltage are applied to the inputs of one input differential pair of the error amplifier, whereas the voltages at both sides of the second wire 53 are applied to the inputs of another input differential pair. Then for example a base band IC, represented by the load 51 in the FIG. 3, always and exactly gets the required voltage over its power terminals at both sides of this load 51, regardless of the IR drops along the complete power supply paths.

Figure 4:
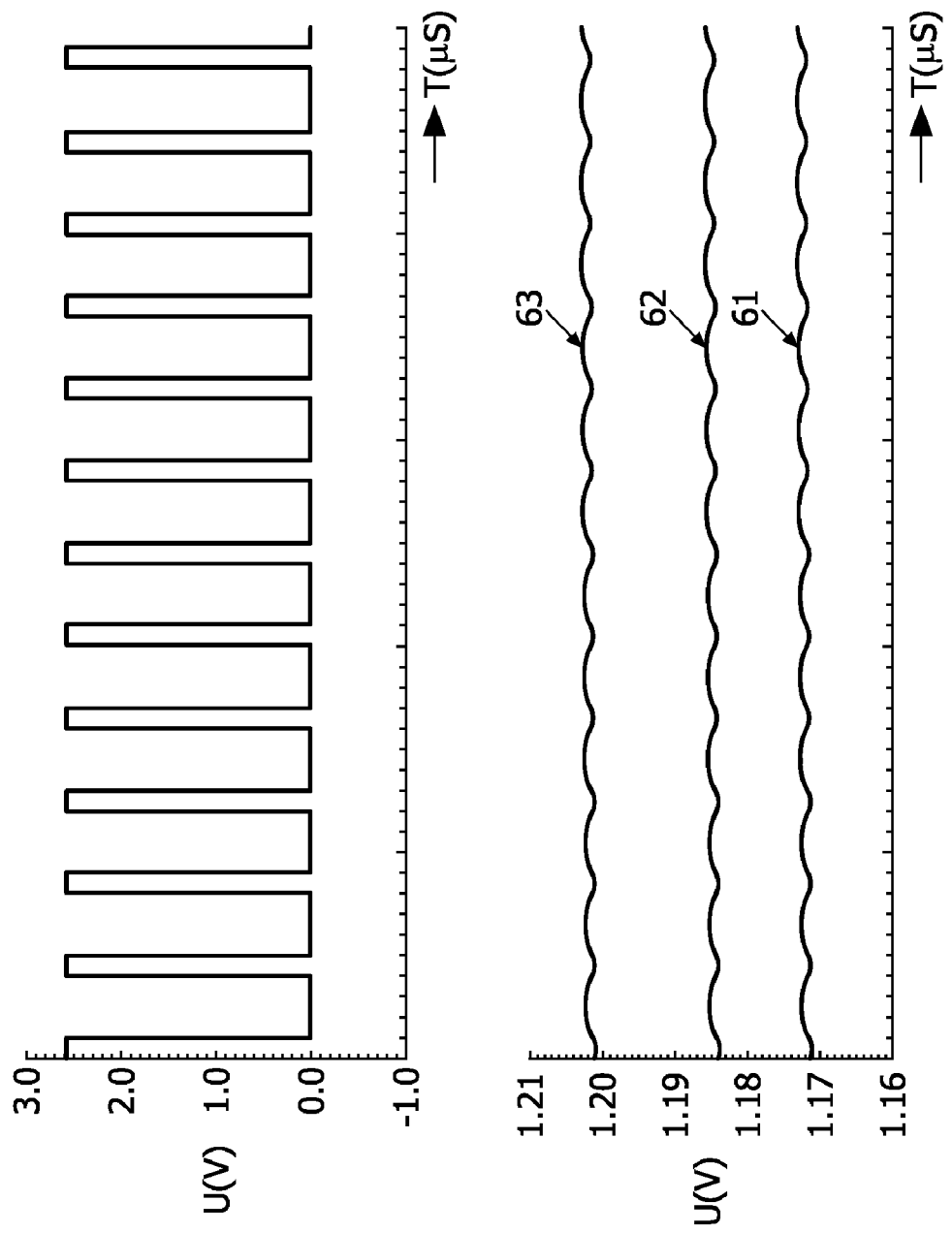
FIG. 4 shows a modulator voltage and an output voltage as a function of time.

In the FIG. 4, a modulator voltage (upper waveform) and an output voltage (lower waveform) as a function of time are shown. This is a simulation verification. A practical example was chosen for the verification. The proposed full and dynamic compensation is implemented in a step-down switching regulator for a digital base band IC operating at a power supply of 1.2V and drawing 300 mA current. A computer simulation has been performed on the regulator and FIG. 4 shows one simulated result with an assumption of the resistance of the wires 52 and 53 being 50 mΩ. The upper waveform is the output of the Pulse Width Modulator stage, while the lower waveform shows the supply voltage over the base band IC. For comparison purposes, in the lower waveform a result with no compensation indicated by 61, a result with conventional partial compensation indicated by 62 and a result with full compensation according to the invention indicated by 63 are shown.

The added additional input differential pair in the circuit 1 does not change the frequency characteristics. The overall output impedance of both input stages under assumption of an ideal current mirror is halved, owing to the fact that the input differential pairs are connected in parallel. At the same time, the overall capacitance of both input stage is doubled, so that practically there is no net change in the time constant at the outputs of both input differential pairs. With a practical current mirror, a two-differential-pair input stage can be designed in such a way that this impedance roughly does not change at all. In this simple way, both loop stability and loop dynamics can be preserved, which are great advantages.

The invention can be used in high demanding applications where accurate and stable supply voltage is the key requirement, IR drop compensation is the only technique to use, especially in low voltage, high current applications such as servers, workstations, networking systems, larger memory arrays, and high-end desktops, etc.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A circuit for converting first and second differential input signals into an output signal, comprising:
   a first differential input stage comprising first and second inputs for receiving the first differential input signal and comprising first and second outputs;
   a second differential input stage comprising third and fourth inputs for receiving the second differential input signal and comprising third and fourth outputs; and
   an output stage including:
      a first terminal connected to the first output;
      a second terminal connected to the second output;
      a third terminal for providing the output signal, the first output further being connected to the third output and the second output further being connected to the fourth output;
      a current mirror stage that comprises a fifth input constituting the first terminal, a fifth output constituting the second terminal, a first pair of transistors comprising control electrodes connected to each other and comprising first main electrodes connected to each other and comprising second main electrodes constituting the fifth input and the fifth output, the fifth input being connected to the control electrodes of the third pair of transistors; and a transistor comprising a control electrode connected to the fifth output and comprising a main electrode constituting the third terminal.

2. The circuit according to claim 1, the first differential input stage comprising a second pair of transistors comprising first main electrodes connected to each other and comprising control electrodes constituting the first and second inputs and comprising second main electrodes constituting the first and second outputs, and the second differential input stage comprising a third pair of transistors comprising first main electrodes connected to each other and comprising control electrodes constituting the third and fourth inputs and comprising second main electrodes constituting the third and fourth outputs.

3. A regulator comprising:
a circuit for converting first and second differential input signals into an output signal, the circuit including:
  a first differential input stage comprising first and second inputs for receiving the first differential input signal and comprising first and second outputs;
  a second differential input stage comprising third and fourth inputs for receiving the second differential input signal and comprising third and fourth outputs; and
  an output stage comprising a first terminal connected to the first output and comprising a second terminal connected to the second output and comprising a third terminal for providing the output signal, the first output further being connected to the third output and the second output further being connected to the fourth output;
a modulator stage for in response to the output signal modulating a voltage supply signal;
a first resistor having a first side connected to the second input and a second side configured to be connected to a first side of a load; and
a second resistor having a first side, connected to the first side of the first resistor, and a second side connected to the fourth input and to ground, the first input being connected to a reference terminal, and the third input being configured to be connected to a second side of the load.

4. The regulator according to claim 3, further comprising:
an inductor having a first side, connected to the modulator stage, and a second side;
a first wire having a first side, connected to the second side of the inductor, and a second side configured to be connected to the first side of the load; and
a second wire having a first side, connected to the ground, and a second side configured to be connected to the second side of the load.

5. A device comprising:
a regulator that includes:
  a circuit for converting first and second differential input signals into an output signal, the circuit including:
    a first differential input stage comprising first and second inputs for receiving the first differential input signal and comprising first and second outputs;
    a second differential input stage comprising third and fourth inputs for receiving the second differential input signal and comprising third and fourth outputs; and
    an output stage comprising a first terminal connected to the first output and comprising a second terminal connected to the second output and comprising a third terminal for providing the output signal, the first output further being connected to the third output and the second output further being connected to the fourth output; and
  a modulator stage for in response to the output signal modulating a voltage supply signal;
a voltage supply for providing the voltage supply signal; and
a load, wherein the regulator includes:
a first resistor having a first side connected to the second input and a second side connected to a first side of the load;
a second resistor having a first side, connected to the first side of the first resistor, and a second side connected to the fourth input and to ground, the first input being connected to a reference terminal, and the third input being connected to a second side of the load.

6. A device according to claim 5, wherein the regulator includes:
an inductor having a first side, connected to the modulator stage, and a second side;
a first wire having a first side, connected to the second side of the inductor, and a second side connected to the first side of the load; and
a second wire having a first side, connected to the ground, and a second side connected to the second side of the load.

7. A method, comprising:
converting first and second differential input signals into an output signal, the converting including:
  receiving the first differential input signal via a first differential input stage comprising first and second inputs for a reception of the first differential input signal and comprising first and second outputs;
  receiving the second differential input signal via a second differential input stage comprising third and fourth inputs for a reception of the second differential input signal and comprising third and fourth outputs; and
  providing the output signal via an output stage comprising a first terminal connected to the first output, a second terminal connected to the second output, a third terminal for a provision of the output signal, the first output further being connected to the third output and the second output further being connected to the fourth output, wherein providing the output signal includes providing the output signal at a main terminal of an output transistor having a control terminal connected to the second and fourth outputs, the output stage also including a current mirror stage that includes a first pair of transistors having control electrodes connected to each other and to the first and third outputs, first main electrodes connected to each other, and second main electrodes connected respectively to the third output and the control terminal of the output transistor.

8. A method according to claim 7, further comprising modulating a voltage supply signal in response to the output signal.

* * * * *